(12) United States Patent
DePesa et al.

(10) Patent No.: US 8,895,324 B2
(45) Date of Patent: Nov. 25, 2014

(54) METHOD OF DETERMINING AN AMOUNT OF IMPURITIES THAT A CONTAMINATING MATERIAL CONTRIBUTES TO HIGH PURITY SILICON

(75) Inventors: Dennis DePesa, Midland, MI (US); Jon Host, Midland, MI (US); Troy Houthoofd, Saginaw, MI (US); Alan Rytlewski, Midland, MI (US)

(73) Assignee: Hemlock Semiconductor Corporation, Hemlock, MI (US)

( * ) Notice: Subject to any disclaimer, the term of this patent is extended or adjusted under 35 U.S.C. 154(b) by 0 days.

(21) Appl. No.: 13/443,466

(22) Filed: Apr. 10, 2012

(65) Prior Publication Data
US 2012/0227472 A1 Sep. 13, 2012

Related U.S. Application Data

(62) Division of application No. 13/121,788, filed as application No. PCT/US2009/058195 on Sep. 24, 2009, now abandoned.

(60) Provisional application No. 61/101,654, filed on Sep. 30, 2008.

(51) Int. Cl.
| | | |
|---|---|---|
| *G01R 31/26* | (2014.01) | |
| *C01B 33/021* | (2006.01) | |
| *F27B 17/00* | (2006.01) | |
| *C30B 33/02* | (2006.01) | |
| *C30B 35/00* | (2006.01) | |
| *C01B 33/037* | (2006.01) | |
| *C30B 29/06* | (2006.01) | |
| *F27D 19/00* | (2006.01) | |

(52) U.S. Cl.
CPC ..... *F27B 17/0033* (2013.01); *F27D 2019/0006* (2013.01); *C01B 33/021* (2013.01); *C30B 33/02* (2013.01); *C30B 35/00* (2013.01); *C01B 33/037* (2013.01); *C30B 29/06* (2013.01); *F27D 19/00* (2013.01)
USPC .......................................... 438/14

(58) Field of Classification Search
USPC ........................ 438/14; 432/247; 257/E21.53
See application file for complete search history.

(56) References Cited

U.S. PATENT DOCUMENTS

| | | | |
|---|---|---|---|
| 2,869,856 A | 1/1959 | Greene | |
| 3,222,217 A | 12/1965 | Grabmaier | |

(Continued)

FOREIGN PATENT DOCUMENTS

| | | |
|---|---|---|
| CN | 101122047 A | 2/2008 |
| DE | 3809594 A1 | 2/1990 |

(Continued)

OTHER PUBLICATIONS

English language abstract and translation for DE 3809594 extracted from the espacenet.com database on Sep. 1, 2011, 9 pages.

(Continued)

*Primary Examiner* — Kevin Parendo
(74) *Attorney, Agent, or Firm* — Cantor Colburn LLP (57) ABSTRACT

A method of determining an amount of impurities that a contaminating material contributes to high purity silicon including the step of partially encasing a sample of high purity silicon in the contaminating material. The sample encased in the contaminating material is heated within a furnace. A change in impurity content of the high purity silicon is determined after the step of heating, compared to an impurity content of the high purity silicon prior to the step of heating. A furnace for heat treating high purity silicon including a housing that defines a heating chamber. The housing is at least partially formed from low contaminant material that contributes less than 400 parts per trillion of impurities to the high purity silicon during heating at annealing temperatures for a sufficient period time to anneal the high purity silicon, and the furnace contributes an average of less than 400 parts per trillion of impurities to the high purity silicon under the same heating conditions.

7 Claims, 4 Drawing Sheets

(56) References Cited

U.S. PATENT DOCUMENTS

| | | | |
|---|---|---|---|
| 3,877,954 A | | 4/1975 | Wustefeld |
| 4,195,067 A | * | 3/1980 | Kotval et al. ............... 423/348 |
| 4,207,066 A | | 6/1980 | Weldon |
| 4,231,809 A | | 11/1980 | Schmidt |
| 5,041,308 A | | 8/1991 | Kuramoto |
| 5,093,284 A | * | 3/1992 | Yoshida et al. ............. 438/767 |
| 5,601,428 A | | 2/1997 | Okoshi et al. |
| 6,676,355 B1 | | 1/2004 | Peyton |
| 6,692,249 B1 | | 2/2004 | Beatty et al. |
| 2003/0080451 A1 | * | 5/2003 | Kitahara et al. ............. 264/7 |
| 2007/0217988 A1 | | 9/2007 | Amendola |
| 2008/0011735 A1 | | 1/2008 | Yang et al. |
| 2008/0289150 A1 | * | 11/2008 | Wada et al. .................. 23/300 |

FOREIGN PATENT DOCUMENTS

| | | |
|---|---|---|
| DE | 3828660 A1 | 3/1990 |
| EP | 1806778 A1 | 7/2007 |
| GB | 659973 | 10/1951 |
| GB | 1403490 | 8/1975 |
| GB | 1500720 | 2/1978 |
| GB | 1500720 A | 2/1978 |
| JP | 3150288 | 6/1991 |
| JP | 05152229 | 6/1993 |
| JP | 07172972 | 7/1995 |
| JP | 07193074 | 7/1995 |
| JP | 08097263 | 4/1996 |
| JP | 11246293 | 9/1999 |
| JP | 2000009388 | 1/2000 |
| JP | 2001351873 | 12/2001 |
| JP | 2005086106 | 3/2005 |
| JP | 2005209813 | 8/2005 |
| JP | 2006300410 | 11/2006 |

OTHER PUBLICATIONS

No English language abstract available for DE 3828660. However, see English language translation extracted from the espacenet.com database Sep. 1, 2011, 11 pages.

English language abstract and translation for JP 05152229 extracted from the PAJ database on Sep. 1, 2011, 19 pages.

English language abstract and translation for JP 07172972 extracted from the PAJ database on Sep. 1, 2011, 25 pages.

English language abstract and translation for JP 07193074 extracted from the PAJ database on Sep. 1, 2011, 28 pages.

English language abstract and translation for JP 08097263 extracted from the PAJ database on Aug. 30, 2011, 12 pages.

English language abstract and translation for JP 11246293 extracted from the PAJ database on Sep. 1, 2011, 36 pages.

English language abstract for JP 3150288 extracted from the espacenet.com database on Aug. 30, 2011, 7 pages.

English language abstract and translation for JP 2000009388 extracted from the PAJ database on Aug. 30, 2011, 25 pages.

English language abstract and translation for JP 2001351873 extracted from the PAJ database on Sep. 1, 2011, 19 pages.

English language abstract and translation for JP 2005086106 extracted from the PAJ database on Sep. 1, 2011, 25 pages.

English language abstract and translation for JP 2005209813 extracted from the PAJ database on Sep. 1, 2011, 27 pages.

English language abstract and translation for JP 2006300410 extracted from the PAJ database on Aug. 30, 2011, 19 pages.

International Search Report for Application No. PCT/US2009/058195 dated Sep. 28, 2010, 9 pages.

* cited by examiner

METHOD OF DETERMINING AN AMOUNT OF IMPURITIES THAT A CONTAMINATING MATERIAL CONTRIBUTES TO HIGH PURITY SILICON

REFERENCE TO CROSS-RELATED APPLICATIONS

This application is a divisional application of U.S. Non-Provisional patent application Ser. No. 13/121,788, filed on Mar. 30, 2011, which claims priority to and all the advantages of International Patent Application No. PCT/US2009/058195, filed on Sep. 24, 2009, which claims priority to U.S. Provisional Patent Application No. 61/101,654, filed on Sep. 30, 2008.

BACKGROUND OF THE INVENTION

1. Field of the Invention

The subject application generally relates to a method of determining an amount of impurities that a contaminating material contributes to a high purity silicon that is heated in the presence of the material, and is further directed to furnace that minimizes the amount of impurities that are contributed from the furnace to the high purity silicon.

2. Description of the Related Art

Methods of processing high purity compositions are known in the art, especially in the semiconductor industry where it is desirable to manufacture high purity crystalline silicons. The amount of impurities in the high purity crystalline silicons directly correlates to performance of the high purity crystalline silicons in semiconductors. Therefore, there is a constant desire to minimize impurity content of the high purity crystalline silicons, as well as a general desire to minimize impurity content in any high purity composition.

Extreme measures are generally taken to minimize the amount of impurities in high purity compositions, such as high purity crystalline silicons, including processing the high purity compositions in clean rooms under atmospheric isolation. Furthermore, personnel working in the clean rooms typically wear protective suits to prevent fibers from clothing or other chemicals that may be introduced into the clean room from the personnel from contaminating the clean environment.

When manufacturing high purity crystalline silicons, in particular, a chemical vapor deposition (CVD) process is generally used to grow polycrystalline silicon on a silicon slim rod from chlorosilane gas, thereby forming a polycrystalline silicon log. After the CVD process, the polycrystalline silicon log is subjected to a zoning process whereby the polycrystalline silicon is converted into single crystalline silicon. As known in the art, impurities present in the polycrystalline silicon log are removed through the zoning process. Alternatively, the polycrystalline silicon log may be used to make silicon slim rods, which are subsequently used to create more polycrystalline silicon logs through the CVD process. To make the silicon slim rods from the polycrystalline silicon logs, the logs must be cut. However, the polycrystalline silicon logs are brittle and must be annealed to reduce internal stresses, which enables the polycrystalline silicon logs to be effectively cut into silicon slim rods without breaking.

To anneal the polycrystalline silicon logs, the logs are placed in a furnace and heated at a sufficient temperature for a sufficient time to anneal the logs. However, annealing contributes impurities to the polycrystalline silicon logs, which is undesirable. More specifically, environmental impurities, such as dust or other molecules present in the ambient atmosphere, may contaminate the polycrystalline silicon logs during annealing. Furthermore, materials that are actually used to form the furnace and that are heated during annealing release impurities contained therein. The impurities released by the materials that are used to form the furnace during annealing are subsequently absorbed by the polycrystalline silicon logs during annealing.

While it is known that impurities are contributed to the polycrystalline silicon logs during annealing, little focus has heretofore been given to reducing the amount of impurities contributed to the polycrystalline silicon logs during annealing. To explain, only polycrystalline silicon logs that are cut into silicon slim rods are generally subject to annealing. Because silicon slim rods account for only a small fraction of the overall volume of the resulting polycrystalline silicon logs made therefrom (typically about 0.6% by volume), the overall amount of impurities in the polycrystalline silicon logs is minimally impacted by the impurities contributed to the silicon slim rods through annealing of polycrystalline silicon logs that are cut to make the silicon slim rods. As such, efforts to minimize the amount of impurities in the polycrystalline silicon logs generally focus on other sources of impurities other than the furnaces used to anneal the polycrystalline silicon logs. However, in the drive to constantly reduce the amount of impurities present in high purity compositions, such as high purity crystalline silicons, there remains a need to reduce the amount of impurities that are contributed to the high purity compositions at all stages of processing, including during annealing, and to provide furnace assemblies that minimize dust generation due to movement of various components of the furnace assemblies or due to movement necessary to introduce the high purity compositions into the furnace.

SUMMARY OF THE INVENTION AND ADVANTAGES

In accordance with the instant invention, a method of determining an amount of impurities that a contaminating material including the impurities contributes to high purity silicon comprises the step of providing the contaminating material. A sample of the high purity silicon is at least partially encased in the contaminating material. The sample at least partially encased in the contaminating material is heated within a furnace. A change in impurity content of the high purity silicon is determined after the step of heating the sample at least partially encased in the contaminating material compared to an impurity content of the high purity silicon prior to the step of heating. Optionally, impurity content of the contaminating material and impurity content of the high purity silicon may be determined in accordance with the method of the instant invention.

A furnace for heat treating high purity silicon comprises a housing. The housing defines a heating chamber of the furnace, and the housing is at least partially formed from low contaminant material that contributes less than 400 parts per trillion of impurities to the high purity silicon during heating of the high purity silicon at annealing temperatures for a sufficient period time to anneal the high purity silicon. Due to the use of the low contaminating material, the furnace contributes an average of less than 400 parts per trillion of impurities to the high purity silicon during heating of the high purity silicon at annealing temperatures for a sufficient period time to anneal the high purity silicon, as measured at monthly intervals over a period of at least four months.

A furnace assembly of the present invention for heat treating a high purity composition comprises a base presenting a hearth for receiving the high purity composition. The base has a periphery. The base also has a seating surface that is defined adjacent to the periphery. A furnace cover that is separate from the base defines a cavity. The furnace cover further defines an opening to the cavity. The base abuts the furnace cover at the seating surface when the furnace cover is disposed on said base, thereby sealing the cavity and forming a heating chamber. The base and the furnace cover are separable for enabling the furnace cover to be removed from the base during insertion and removal of the high purity composition from the heating chamber.

The method of determining the amount of impurities that a contaminating material including the impurities contributes to high purity silicon, as well as the furnace and the furnace assembly of the instant invention, each provide advantages in that each plays a role to reduce the amount of impurities present in high purity compositions, such as high purity crystalline silicon compositions, by focusing on aspects of the step of annealing. For example, the method may be used to determine optimum materials for various components of furnaces and furnace assemblies based on the amount of impurities that tested materials contribute to high purity silicon, thereby minimizing contribution of impurities from the materials of the furnace itself. As such, determinations made from the method may be used to design furnaces and furnace assemblies having the housing that is at least partially formed from low contaminant material, i.e., determinations made from the method may be used to identify the low contaminant material. Finally, the furnace assemblies in accordance with the instant invention minimize dust generation due to movement of various components of the furnace assemblies or due to movement necessary to introduce the high purity compositions into the furnace. By providing the furnace cover separate from the base, the furnace cover can be vertically lifted and lowered onto the base, thereby eliminating lateral movement that is more likely to disturb dust and other debris that could be disposed on the furnace cover. The combined effect of the method, the furnace, and the furnace assembly of the instant invention is to minimize the amount of impurities that are contributed to high purity compositions, especially high purity crystalline silicon, when the high purity compositions are heated in the furnace.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Production of high purity compositions, especially high purity silicon, involves careful control of environmental conditions surrounding the production process to ensure that impurities from the ambient atmosphere or other sources (such as machinery that is used to produce the high purity compositions) contributes minimal amounts of impurities to the high purity composition. In this manner, a method of determining an amount of impurities that a contaminating material including the impurities contributes to high purity silicon, a furnace 10 for heat treating high purity silicon, and a furnace assembly 14 for treating a high purity composition of the instant invention each present unique improvements to the current production of high purity compositions. While the instant method of determining an amount of impurities that a contaminating material contributes to high purity silicon and the furnace 10 for heat treating high purity silicon present particular improvements to the current production of high purity silicon, the furnace assembly 14 has broad use outside of the particular field of production of high purity silicon and extends to any high purity composition.

A "high purity composition", as the phrase is used herein, means any composition that is heated in a furnace and in which the effect of impurities introduced from particles, such as dust, or from other molecules in the ambient atmosphere on the composition is generally undesirable. More particularly, a high purity composition is one having an impurity content of less than or equal to 1,000 parts per million atomic (ppma). An impurity, as the term is generally used herein, is defined as an element or a compound the presence of which is undesirable in the high purity composition. A "high purity silicon", as the phrase is used herein, means a silicon having an impurity content of less than or equal to 1,000 parts per billion atomic (ppba). However, it is to be appreciated that within the class of high purity silicons, additional distinctions between silicons can be made based on sequentially lower impurity contents. While the above threshold for characterizing a silicon as high purity silicon provides an upper limit for the impurity content of silicons that can still be characterized as high purity silicons, the high purity silicons typically have substantially lower impurity content than the threshold set forth above. In particular, the high purity silicon can have an impurity content of less than or equal to 3 ppba, alternatively less than or equal to 500 parts per trillion atomic (ppta). An impurity, as the term is specifically used in the context of high purity silicon, is selected from the group of aluminum, arsenic, boron, phosphorous, iron, nickel, copper, chromium, and combinations thereof. The impurity content, as used in the context of high purity silicon, generally refers to the total amount of all impurities present in the high purity silicon unless otherwise noted.

The method of determining the amount of impurities that a contaminating material contributes to high purity silicon has many uses. When establishing processing conditions and developing machinery for producing high purity silicon, any material that is in direct physical or ambient communication with the high purity silicon can possibly contribute impurities to the high purity silicon, especially when the impurity content of the high purity silicon is desired to be less than or equal to 3 ppba or less than or equal to 500 ppta. However, under certain conditions, material that is in direct physical or ambient communication with the high purity silicon can contribute even greater amounts of impurities to the high purity silicon.

For example, when material is heated, many impurities present therein are subject to release, and the released impurities can be absorbed by the high purity silicon. As such, any material that is subject to heating in the presence of high purity silicon can have a significant effect on impurity contribution to the high purity silicon.

It has been discovered that testing materials and determining the impurity content of the materials is insufficient to determine to what extent the materials will contribute impurities to the high purity silicon, the reason possibly being that different impurities escape from different materials at different rates. Further, different impurities are absorbed into high purity silicon at different rates. However, the method of determining the amount of impurities that a contaminating material contributes to high purity silicon addresses this issue. The method optionally includes the steps of determining the impurity content of the contaminating material and, optionally, determining impurity content of the high purity silicon; however, it is to be appreciated that this information can be obtained from other sources such as product literature. Methods of determining the impurity content of the contaminating material and the high purity silicon are known in the art. However, such methods of determining impurity content should be sufficiently sensitive to detect impurities at parts per trillion atomic levels. Examples of such methods include inductively-coupled plasma (TCP) mass spectrometry and photoluminescence analysis.

The method includes the step of providing the contaminating material. A "contaminating material", as the phrase is used herein, refers to any material that is to be tested for purposes of determining the amount of impurities that the material contributes to high purity silicon. In fact, the contaminating material need not necessarily contaminate the high purity silicon. While the contaminating material includes a level of impurities, the actual amount of impurities present in the contaminating material does not have significant bearing on the impurity contribution of the contaminating material on the high purity silicon. Rather, the propensity of the contaminating material to release the impurities contained therein under heating primarily controls the impurity contribution of the contaminating material to high purity silicon. However, one may assume that lower amounts of impurities in the contaminating material may correlate to lower impurity contribution of similar contaminating materials on the high purity silicon. While it is to be appreciated that the method of the instant invention is not limited to the testing of any particular contaminating material, typical contaminating materials that are tested in accordance with the method include at least one ceramic present in an amount of at least 40 percent by weight based on the total weight of the contaminating material. Examples of suitable ceramics that may be present in the contaminating material may be selected from the group of aluminium oxide, silicon dioxide, silicon carbide, and combinations thereof. While it is to be appreciated that the at least one ceramic is typically present in the amount of at least 40 percent by weight based on the total weight of the contaminating material, the total amount of ceramics present in the contaminating material is typically at least 90 percent by weight, more typically at least 99 percent by weight, based on the total weight of the contaminating material.

A sample of the high purity silicon is at least partially encased in the contaminating material. More specifically, the contaminating material may be provided in various forms, such as, but not limited to, a powder or particulate (in which case the high purity silicon may be buried within the powder or particular to thereby encase the high purity silicon), a cylinder (in which case the high purity silicon may be place in the cylinder to thereby encase the high purity silicon), or chunks of the contaminating material (in which case the chunks of material may be placed around and on top of the high purity silicon to thereby encase the high purity silicon). The purpose of at least partially encasing the high purity silicon in the contaminating material is to at least partially impede gas flow around the high purity silicon.

The sample of the high purity silicon typically has an impurity content of less than or equal to 500 ppta; however, it is to be appreciated that the impurity content of the high purity silicon is less important than using high purity silicon samples having consistent impurity content in parallel testing of various contaminating materials. Typically, variation in impurity content of the high purity silicon that is at least partially encased in various contaminating materials is no greater than 50 ppta.

The sample at least partially encased in the contaminating material is then heated within a furnace. The type of furnace used to heat the encased sample is immaterial due to the fact that the sample in the contaminating material sufficiently prevents impurities from the furnace from reaching the high purity silicon encased therein. The encased sample is heated at a temperature of at least 1650° F. for a period of at least 200 minutes, which is a sufficient amount of time at a sufficiently high temperature to determine the amount of impurities that the contaminating material contributes to the high purity silicon. It is to be appreciated that actual heating temperatures and heating times of the high purity silicon may be higher or longer, respectively, than the temperatures and times set forth above so long as the encased samples are subject to heating for consistent temperatures and times in parallel testing of various contaminating materials.

A change in impurity content of the high purity silicon is determined after the step of heating the sample at least partially encased in the contaminating material compared to an impurity content of the high purity silicon prior to the step of heating. As set forth above in the context of the optional step of determining the impurity content of the high purity silicon, methods of determining the impurity content of the high purity silicon are known in the art, and the methods of determining impurity content should be sufficiently sensitive to detect impurities at parts per trillion atomic levels. The impurity content is typically determined for individual impurities present in the high purity silicon, and different impurities may be measured through different methods. For example, photoluminescence analysis is typically utilized to determine impurity content of impurities such as aluminum, arsenic, boron, and phosphorous. Further, it is generally useful to determine the impurity content of specific impurities that are more problematic compared to other impurities. For example, copper is a particularly problematic impurity that quickly diffuses into high purity silicon as compared to other impurities, such as aluminum. Therefore, the amount of copper contributed to high purity silicon from the contaminating material is of particular significance, and there is a strong desire to identify materials that contribute minimal amounts of copper to high purity silicon and use such materials for machinery used to heat treat high purity silicon.

As set forth above, the method of determining the amount of impurities that the contaminating material contributes to high purity silicon has many uses. For example, based on the determined amount of impurities that the contaminating material contributes to the high purity silicon, low contaminant materials may be selected to form various components of the furnace 10 that is used for heat treating high purity silicon. "Low contaminant material", as the phrase is used herein, means any material that contributes less than 400 ppta of impurities to high purity silicon during heating of the high purity silicon at annealing temperatures for a sufficient period of time to anneal the high purity silicon, as determined through the method of determining the amount of impurities contributed by the contaminating material as set forth above. Typical annealing temperatures are at least 1650° F., alternatively from 1650 to 2700° F., and typical annealing times are typically at least 200 minutes.

Low contaminant materials that have been identified for purposes of the instant invention typically comprise a compound selected from the group of aluminium oxide, silicon dioxide, silicon carbide, and combinations thereof. For example, low contaminant material suitable for purposes of the instant invention typically comprises aluminium oxide in an amount of at least 40 percent by weight based on the total weight of said low contaminant material. In some instances, the low contaminant material comprises aluminium oxide in an amount of at least 90 percent by weight based on the total weight of said low contaminant material. In addition to or as an alternative to the aluminium oxide, the low contaminant material may comprise the silicon dioxide. The silicon dioxide may be present in the low contaminant material in an amount of from 0.1 to 60, alternatively from 0.1 to 10, alternatively from 0.1 to 1.0 percent by weight based on the total weight of the low contaminant material. Specific examples of low contaminant materials that are suitable for purposes of the instant invention include, but are not limited to, those commercially available under the trade names Ceralox® SPA-59 (Alpha), Unicote® S, CoorsTek® AD 96, CoorsTek® AD 995, CoorsTek® AD 998, Maftec®, Saffil®, and K-26.

Figure 1:
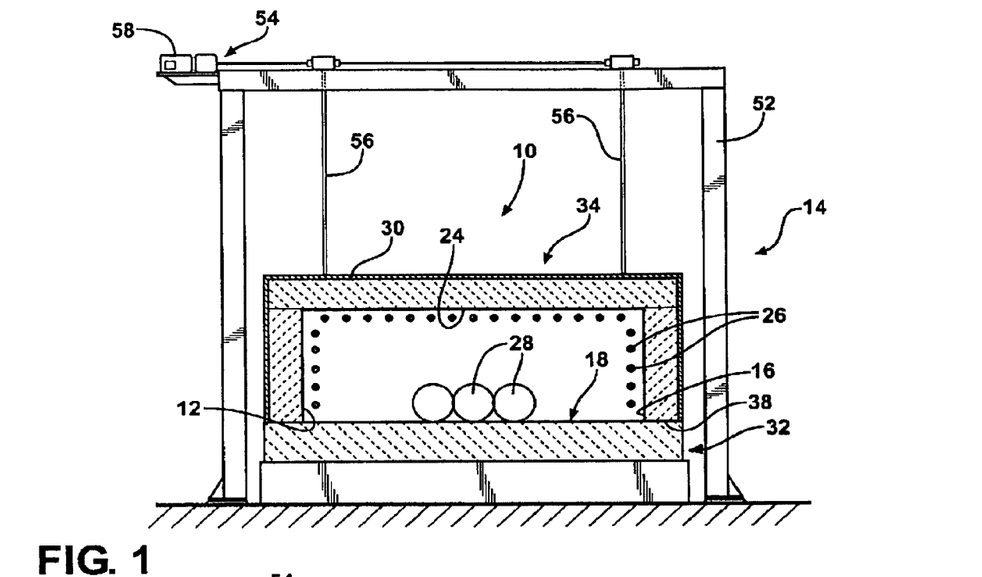
FIG. 1 is a schematic cross-sectional side view of a furnace assembly including a base and a furnace cover in accordance with the instant invention.
Figure 2:
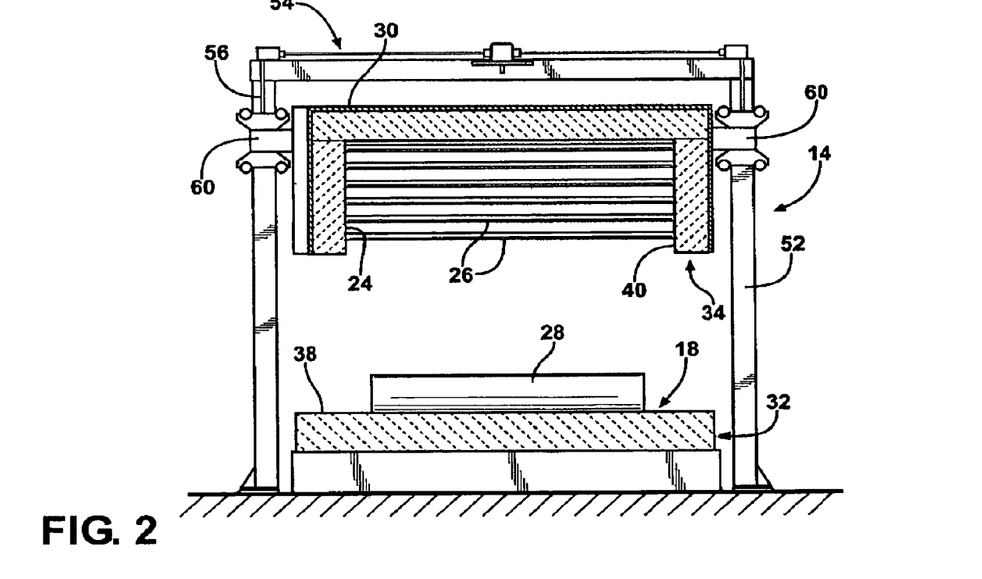
FIG. 2 is a schematic cross-sectional front view of the furnace assembly of FIG. 1.
Figure 3:
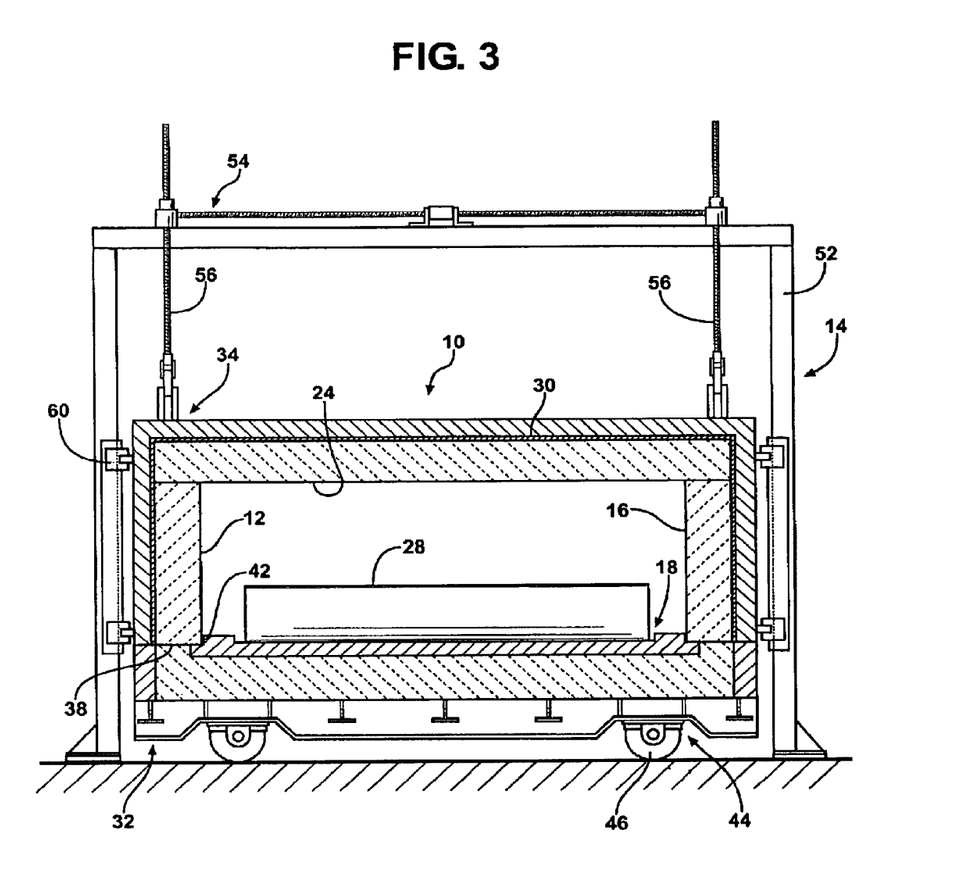
FIG. 3 is a schematic cross-sectional side view of another embodiment of the furnace assembly including a base comprising a transport mechanism and a furnace cover in accordance with the instant invention.
Figure 4:
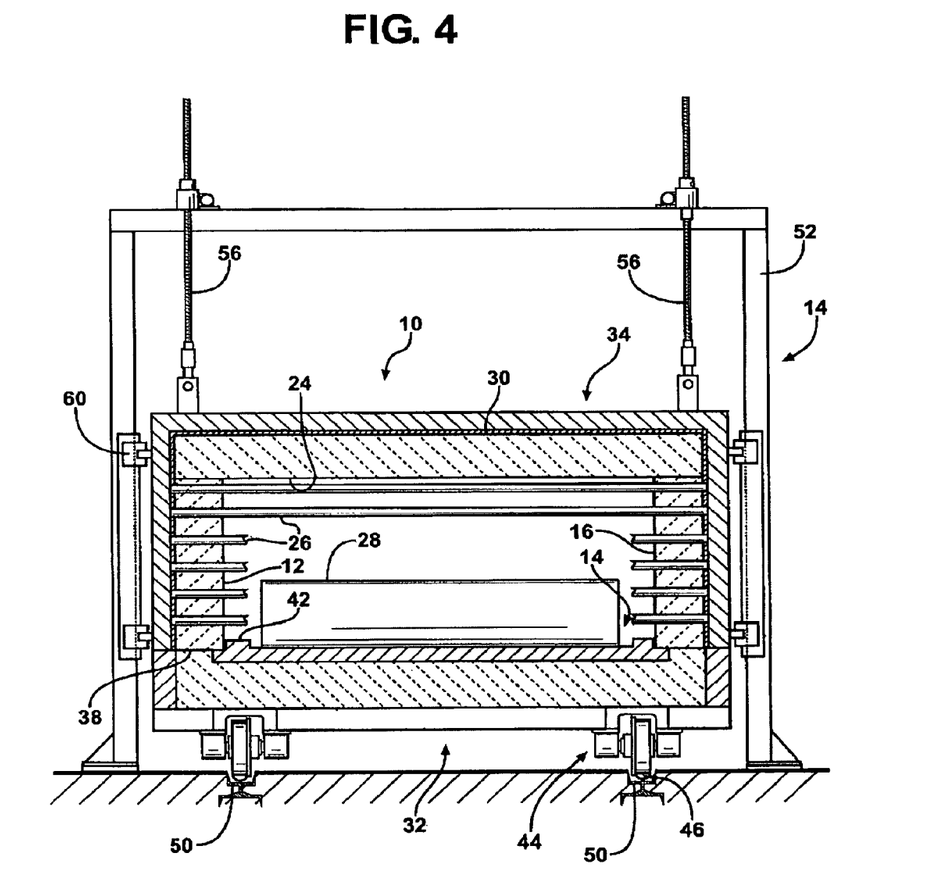
FIG. 4 is a schematic cross-sectional front view of the furnace assembly of FIG. 3.
Figure 5:
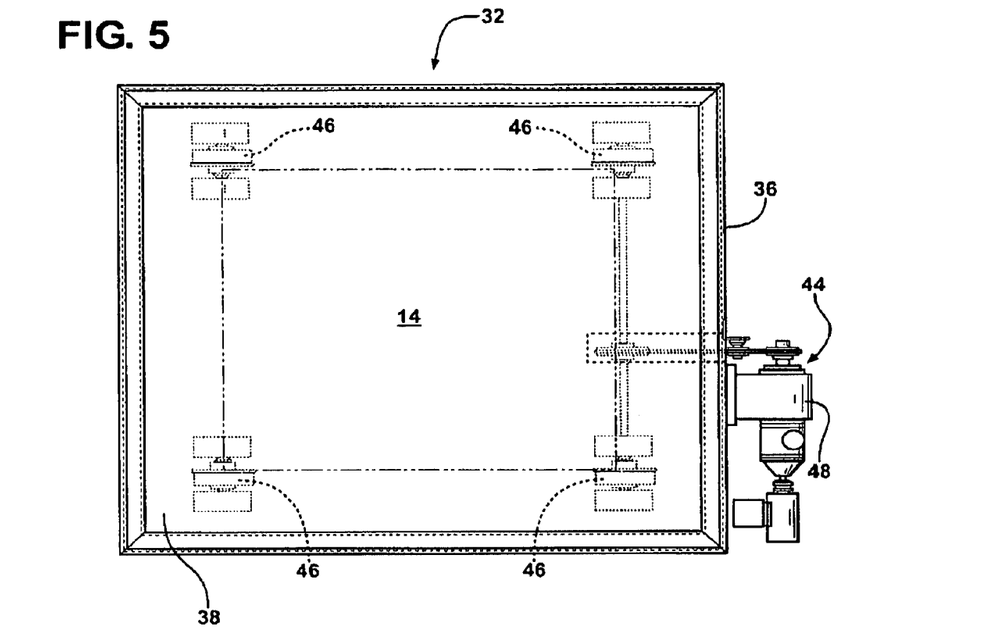
FIG. 5 is a schematic top view of another embodiment of the base of the furnace assembly of FIG. 3.
Figure 6:
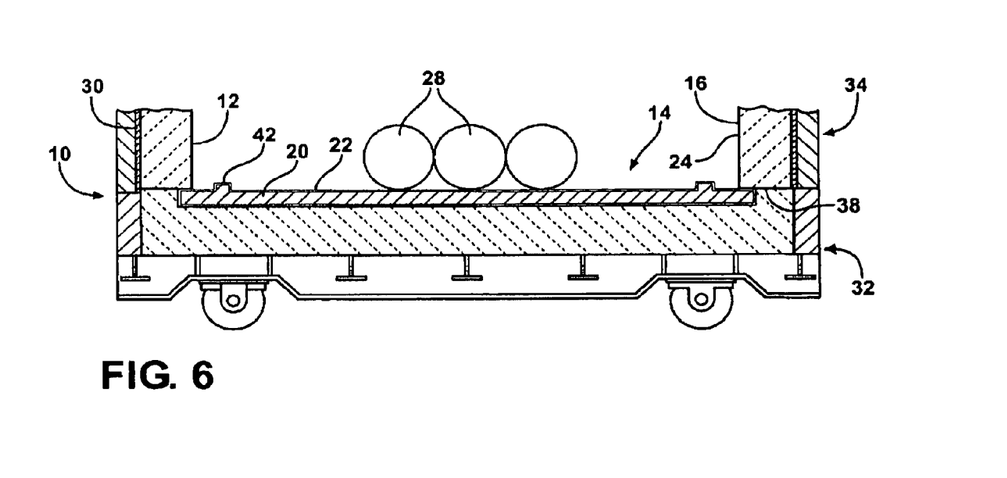
FIG. 6 is a schematic partial cross-sectional side view of another embodiment of the furnace assembly including a base comprising a transport mechanism and a furnace cover in accordance with the instant invention.

The furnace in accordance with the instant invention is generally shown at 10 in FIGS. 1, 3, and 4. The furnace 10 includes a housing 12 which defines a heating chamber 16 of the furnace 10. The term "housing" generally encompasses any component or combination of components that, together, define the heating chamber 16. To "define" the heating chamber 16, a component must have a surface in direct atmospheric communication with the heating chamber 16. Typically, the housing 12 comprises a plurality of components that define the heating chamber 16 with each component having a surface in atmospheric communication with the heating chamber 16. For example, one of the components that may define the heating chamber 16 is a hearth 18 for receiving the high purity silicon. As shown in FIG. 6, the hearth 18 may be further defined as a layered composite with at least two layers, typically with more than two layers, such as a hearth cap 22 that is disposed on a middle hearth 20. The hearth cap 22 is in direct atmospheric communication with the heating chamber 16, and the middle hearth 20 is separated from the heating chamber 16 by the hearth cap 22. In this embodiment, materials used to form the various layers of the hearth 18 may be selected to impart the hearth 18 with different properties, as described in further detail below. Additionally, the housing 12 includes a hot face 24, which includes portions of the housing 12 that define the heating chamber 16 but which do not receive the high purity silicon, i.e., the high purity silicon typically does not physically contact the hot face 24. Heating elements 26 are another example of components that define the heating chamber 16. As shown in FIGS. 1, 2, and 4, the heating elements 26 typically extend into and through the heating chamber 16, adjacent to the hot face 24 of the housing 12. The heating elements 26 typically include a coating that comprises low contaminant material disposed on silicon carbide.

The heating chamber 16 typically has a volume of at least 10,000 cm$^3$, alternatively at least 100,000 cm$^3$, which is sufficient to accommodate polycrystalline silicon logs 28 within the heating chamber 16.

The housing 12 is at least partially formed from low contaminant material as described above. More specifically, when the housing 12 comprises a plurality of components that define the heating chamber 16, at least one of the components described above is formed from the low contaminant material. However, it is to be appreciated that each component of the housing 12 may be independently formed from low contaminant material as described above. The particular low contaminant material that is used to form particular components of the housing 12 is typically selected based upon the location of the component within the housing 12 and the relative effect such components have on impurity content of the high purity silicon based on the location of the component. For example, the hearth 18 is typically formed from a low contaminant material that contributes less impurities to high purity silicon than materials used to form the hot face 24 due to the proximity of the hearth 18 to the high purity silicon. When the hearth 18 is the layered composite, the hearth cap 22 is typically formed from low contaminant material, while the middle hearth 20 or other layers that are not in direct atmospheric communication with the heating chamber 16 may be formed from materials other than low contaminant material to provide other physical properties such as, for example, strength or thermal conductivity. Alternatively, more than one layer of the hearth 18 may be formed from low contaminant material. For example, in one embodiment, the hearth cap 22 comprises a ceramic fiber formed from low contaminant material, and the middle hearth 20 comprises firebrick coated with low contaminant material, with the ceramic fiber disposed on the coated firebrick. An example of the ceramic fiber is Maftec®, and an example of firebrick coated with low contaminant material is Korundal XD coated with Ceralox® SPA-59.

It is to be appreciated that the furnace 10 may include other components, hereinafter referred to as outer components, in addition to the housing 12 as defined herein. The outer components may include additional layers and/or structures that are not in direct atmospheric communication with the heating chamber 16, such as an outer casing 30 of the furnace 10. The outer components may be present to provide strength, thermal conductivity, or other properties to the furnace 10. However, materials used to form such components are not typically selected based on impurity contribution of the materials to high purity silicon due to the fact that the heating chamber 16 is insulated from the outer components by the housing 12.

A method of treating high purity silicon, such as polycrystalline silicon logs 28, includes heating the high purity silicon in the furnace 10 as described above. The step of heating the high purity silicon may be further defined as annealing the high purity silicon at annealing temperatures for a sufficient period of time to anneal the high purity silicon. However, as described above in the context of the method of determining the amount of impurities that the contaminating material including the impurities contributes to high purity silicon, it is to be appreciated that actual annealing temperatures and annealing times may be higher or longer, respectively, than the temperatures and times set forth above.

Overall, the furnace 10 in accordance with the instant invention contributes an average of less than or equal to 400 ppta of impurities, alternatively less than or equal to 300 ppta of impurities, as measured at monthly intervals over a period of at least four months. In terms of individual impurities, the furnace 10 in accordance with the instant invention typically contributes an average of less than or equal to 50 ppta of copper, alternatively less than or equal to 30 ppta, alternatively less than 20 ppta to the high purity silicon during heating of the high purity silicon at the annealing temperatures for the sufficient period of time to anneal the high purity silicon, as measured at monthly intervals over a period of at least four months.

The furnace assembly is shown generally at 14 in FIGS. 1-4. While the furnace assembly 14 typically includes the furnace 10 including the housing 12 that is at least partially formed from low contaminant material, as described above, it is to be appreciated that the furnace assembly 14 is not so limited. In particular, the furnace assembly 14 may be used to heat high purity compositions other than high purity silicon, and low contaminant materials as described above need not necessarily be used to form components of the furnace assembly 14. The furnace assembly 14 provides advantages relative to minimizing impurities in high purity compositions due to the manner in which the furnace assembly 14 is configured and operated, and such advantages are distinct from advantages attributable to selection of low contaminant materials for components of the furnace 10 as described above. For example, the furnace assembly 14 at least minimizes the presence of impurities that are attributable to dust generation. The furnace assembly 14 also provides safety advantages over existing furnace assemblies, as is apparent from the description of the furnace assembly 14 below.

As best shown in FIG. 2, the furnace assembly 14 for heat treating the high purity composition comprises a base 32 and a furnace cover 34 that is separate from the base 32. The base 32 has a periphery 36 and a seating surface 38 defined adjacent to the periphery 36. Typically, the seating surface 38 is continuous about the periphery 36 of the base 32. The furnace cover 34 is separate from the base 32 and defines a cavity 40 and an opening to the cavity 40. As shown in FIGS. 1, 3, 4, and 6, the base 32 abuts the furnace cover 34 at the seating surface 38 when the furnace cover 34 is disposed on the base 32, thereby sealing the cavity 40 and forming a heating chamber 16. As best shown in FIG. 6, the seating surface 38 is typically recessed within the base 32, and the base 32 may further comprise a wall 42 that extends away from the base 32. The wall 42 may be disposed adjacent to the seating surface 38 for aligning the furnace cover 34 on the base 32. The recessed seating surface 38, in combination with the wall 42 that extends away from the base 32, serve dual functions of assisting with alignment of the furnace cover 34 on the base 32 and adequately sealing the cavity 40 and forming the heating chamber 16.

The base 32 and the furnace cover 34 are separable for enabling the furnace cover 34 to be removed from the base 32 during insertion and removal of the high purity composition from the heating chamber 16, as described in further detail below in the context of a method of heat treating the high purity composition in the furnace assembly 14.

As best shown in FIGS. 3, 4, and 6, the base 32 presents the hearth 18 for receiving the high purity composition. The hearth 18 may be the layered composite as described above in the context of the furnace 10 of the instant invention and as shown in FIG. 6. Referring to FIGS. 3-6, the base 32 may also comprises a transport mechanism 44 to enable movement of the base 32. The transport mechanism 44 may include wheels 46, a drive track (not shown), or any other feature that enables movement of the base 32 along a surface such as a floor. The transport mechanism 44 of the base 32 also typically comprises a motor 48 for propelling the base 32. As shown in FIG. 4, tracks 50 may be disposed in the floor for receiving the wheels of the base 32. The tracks 50 serve to direct the base 32 into a proper position relative to the furnace cover 34 such that the furnace cover 34 and the base 32 may be joined through vertical relative movement.

The furnace assembly 14 typically comprises a frame 52 including an elevating mechanism 54 that is attached to the furnace cover 34 for raising and lowering the furnace cover 34. In one embodiment, as shown in FIGS. 1-4, the elevating mechanism 54 comprises at least one elevating screw 56 for raising and lowering the furnace cover 34 in response to rotation of said elevating screw 56. Typically, the elevating mechanism 54 includes at least one elevating screw 56 disposed at each corning of the furnace cover 34. The elevating screws 56 may be rotated using an elevating motor 58, with resulting movement of the furnace cover 34 restricted to movement along a vertical axis, i.e., the elevating screws 56 deter horizontal movement of the furnace cover 34. However, it is to be appreciated that while horizontal movement of the furnace cover 34 is deterred, under some circumstances the furnace assembly 14 may include features that enable horizontal movement of the furnace cover 34, and that the elevating screws 56 do not necessarily prevent horizontal movement of the furnace cover 34. The furnace cover 34 may also include guides 60 for further stabilizing the furnace cover 34 during movement. Dust generation is minimized by essentially restricting the movement of the furnace cover 34 to vertical movement.

As set forth above, the furnace assembly 14 may include the furnace 10 as described above that includes the housing 12 at least partially formed from the low contaminant material, especially when the furnace assembly 14 is adapted to treat high purity silicon. More specifically, in the context of the unique features of the furnace assembly 14 as described herein, the housing 12 comprises the base 32 and the furnace cover 34. As such, at least one of the base 32 and the furnace cover 34 may be at least partially formed from low contaminant material. The low contaminant material is set forth and defined above. As with the furnace 10 as described above, the furnace assembly 14 that includes at least one of the base 32 and the furnace cover 34 at least partially formed from low contaminant material typically contributes an average of less than 400 parts per trillion of impurities to the high purity silicon during heating of the high purity silicon in the heating chamber 16 at the annealing temperatures for the sufficient period of time to anneal the high purity silicon, as measured at monthly intervals taken over the period of at least four months.

The furnace assembly 14 may also include additional features that are designed to minimize dust generation. For example, materials including greases and lubricants can be disposed on portions of the furnace assembly 14 that are known to generate dust for the purpose of reducing airborne dust. Additionally, exposed screws 56 (such as those for the lifting of the furnace cover 34) can be covered.

A method of heat treating the high purity composition in the furnace assembly 14 includes the step of disposing the high purity composition on the hearth 18. When the high purity composition is further defined as polycrystalline silicon logs 28, the polycrystalline silicon logs 28 may be disposed directly on the hearth 18. A relative position of the furnace cover 34 is arranged to the base 32 with the furnace cover 34 in an elevated position relative to the base 32. In this regard, the furnace cover 34 may be raised above the base 32 using the elevating mechanism 54 (as shown in FIGS. 1 and 2), or the base 32 may be moved into a recess (not shown) below the furnace cover 34. Regardless of the manner in which it occurs, the base 32 is positioned beneath the furnace cover 34. The furnace cover 34 is lowered onto the base 32 to form the furnace 10 defining the heating chamber 16, with the high purity composition disposed within the heating chamber 16. Once the furnace cover 34 is in place on the base 32, the high purity composition is heated within the heating chamber 16.

When the base 32 comprises the transport mechanism 44, the step of positioning the base 32 may include moving the base 32 into a position beneath the elevated furnace cover 34. By including the transport mechanism 44 on the base 32, the base 32 can be moved under the furnace cover 34 prior to heat treating the high purity composition, and can be moved out from under the furnace cover 34 after heat treating the high purity composition while restricting the furnace cover 34 to movement along the vertical axis. By restricting the furnace cover 34 to movement along the vertical axis, operational improvements are realized in providing the high purity composition into the heating chamber 16, while also maximizing safety due to the difficulty and potential hazards associated with handling high purity compositions, such as polycrystalline silicon logs 28.

The following examples are meant to illustrate the invention and are not to be viewed in any way as limiting to the scope of the invention.

EXAMPLES

Various contaminating materials including impurities are tested in accordance with the method of the instant invention to determine an amount of impurities that the contaminating materials contribute to high purity silicon. More specifically, high purity silicon having an impurity content of less than or equal to 500 ppta is encased in various materials to determine the amount of impurities that the contaminating materials contribute to the high purity silicon. The samples encased in the contaminating material are heated at an annealing temperature for a sufficient period of time to anneal the high purity silicon.

Based on the determinations made relative to the amount of impurities that the contaminating materials contributes to high purity silicon, low contaminating materials are identified and used to form various components of a housing of a furnace. In particular, the housing is formed from the following components and materials:

| Component | Material |
| --- | --- |
| Hot Face | Pyroblock ® M Zr |
| Heating Elements | Silicon Carbide Coated With Silicon Dioxide |
| Hearth Cap | Compressed Maftec ® |
| Middle Hearth | SR-99LS Fire Brick Coated With Ceralox ® SPA-59 |
| Bottom Hearth | K-26 Coated With Ceralox ® SPA-59 |

Additionally, an outer casing may be disposed around the housing of the furnace, and the outer casing may be formed from metal such as steel. The outer casing may be passivated through any industrial passivation procedure such as, for example, passivation with citric gel.

Polycrystalline silicon logs are heat treated in the furnace that is described above. The polycrystalline silicon logs have an impurity content of less than or equal to 500 ppta. The polycrystalline silicon logs are disposed on the hearth and are annealed at an annealing temperature for a sufficient period of time to anneal the polycrystalline silicon logs. After annealing, the polycrystalline silicon logs have impurity contents as set forth below in Table I, listed as parts per billion atomic.

TABLE 1

| Sample ID | Al | As | B | P |
| --- | --- | --- | --- | --- |
| January Monthly | 235955 | 0.0005 | 0.0005 | 0.0017 | 0.0117 |
| January Monthly | 235956 | | | | |
| February Monthly | 238512 | 0.0012 | 0.0005 | 0.0012 | 0.0141 |
| February Monthly | 238513 | | | | |
| March Monthly | 239957 | 0.0005 | 0.0005 | 0.0014 | 0.0122 |
| March Monthly | 239966 | | | | |
| April Monthly | 241681 | 0.0013 | 0.0005 | 0.0009 | 0.0107 |
| April Monthly | 241682 | | | | |
| Average: | | 0.0009 | 0.0005 | 0.0013 | 0.0122 |

| Sample ID | Fe | Ni | Cu | Cr | Total Impurities |
| --- | --- | --- | --- | --- | --- |
| January Monthly | 235955 | 0.019 | 0.152 | 0.033 | 0.010 | 0.2284 |
| January Monthly | 235956 | 0.010 | 0.051 | 0.023 | 0.010 | 0.0940 |
| February Monthly | 238512 | 0.325 | 0.064 | 0.021 | 0.032 | 0.4590 |
| February Monthly | 238513 | 0.208 | 0.049 | 0.011 | 0.010 | 0.2780 |
| March Monthly | 239957 | 0.010 | 0.010 | 0.010 | 0.010 | 0.0546 |
| March Monthly | 239966 | 0.010 | 0.010 | 0.010 | 0.010 | 0.0400 |
| April Monthly | 241681 | 0.151 | 0.010 | 0.010 | 0.014 | 0.1984 |
| April Monthly | 241682 | 0.022 | 0.021 | 0.010 | 0.010 | 0.0630 |
| Average: | | 0.0944 | 0.0459 | 0.0160 | 0.0133 | 0.1844 |

The average impurity content of the polycrystalline silicon logs, as measured at monthly intervals over a period of at least four months (when all impurities are measured), is about 0.235 ppba, or 235 ppta.

Comparative Example

An existing furnace is provided with the housing is formed from the following components and materials:

| Component | Material |
| --- | --- |
| Hot Face | Pyroblock ® M Zr |
| Heating Elements | Uncoated Silicon Carbide |
| Hearth | Cerox ® 500 |
| Bottom Hearth | Uncoated Firebrick |

Polycrystalline silicon logs are heat treated in the existing furnace that is described above in the same manner as the polycrystalline silicon logs are heat treated in the Example. After annealing, the polycrystalline silicon logs have impurity contents as set forth below in Table II, listed as parts per billion atomic.

TABLE II

| Sample ID | Al | As | B | P |
| --- | --- | --- | --- | --- |
| January Monthly | 210939 | 0.0005 | 0.0008 | 0.0023 | 0.0105 |

TABLE II-continued

| Sample ID | | | | | |
|---|---|---|---|---|---|
| January Monthly | 210940 | | | | |
| February Monthly | 214565 | 0.0005 | 0.0010 | 0.0021 | 0.0101 |
| February Monthly | 214566 | | | | |
| March Monthly | 216157 | 0.0005 | 0.0010 | 0.0021 | 0.0121 |
| March Monthly | 215158 | | | | |
| April Monthly | 217632 | 0.0005 | 0.0007 | 0.0016 | 0.0084 |
| April Monthly | 217633 | | | | |
| May Monthly | 220627 | 0.0005 | 0.0009 | 0.0012 | 0.0095 |
| May Monthly | 220628 | | | | |
| June Monthly | | | | | |
| June Monthly | | | | | |
| July Monthly | 224311 | | | | |
| July Monthly | 224312 | | | | |
| August Monthly | 227198 | 0.0084 | 0.0036 | 0.0033 | 0.0239 |
| August Monthly | 227199 | | | | |
| September Monthly | 228043 | 0.0005 | 0.0006 | 0.0022 | 0.0151 |
| September Monthly | 228044 | | | | |
| October Monthly | 229922 | 0.0005 | 0.0005 | 0.0016 | 0.0144 |
| October Monthly | 229923 | | | | |
| Average: | | 0.0015 | 0.0011 | 0.0021 | 0.0130 |

| | Sample ID | Fe | Ni | Cu | Cr | Total Impurities |
|---|---|---|---|---|---|---|
| January Monthly | 210939 | 0.058 | 0.257 | 0.227 | 0.010 | 0.5661 |
| January Monthly | 210940 | 0.075 | 0.067 | 0.032 | 0.010 | 0.1840 |
| February Monthly | 214565 | 0.065 | 0.030 | 0.108 | 0.010 | 0.2267 |
| February Monthly | 214566 | 0.216 | 0.060 | 1.973 | 0.010 | 2.2590 |
| March Monthly | 216157 | 0.014 | 0.014 | 0.010 | 0.010 | 0.0637 |
| March Monthly | 215158 | 0.032 | 0.016 | 0.020 | 0.010 | 0.0780 |
| April Monthly | 217632 | 0.292 | 0.090 | 2.036 | 0.010 | 2.4392 |
| April Monthly | 217633 | 0.139 | 0.042 | 0.065 | 0.010 | 0.2560 |
| May Monthly | 220627 | 0.086 | 0.021 | 0.025 | 0.010 | 0.1541 |
| May Monthly | 220628 | 0.066 | 0.020 | 0.061 | 0.010 | 0.1570 |
| June Monthly | | | | | | 0.0000 |
| June Monthly | | | | | | 0.0000 |
| July Monthly | 224311 | 0.158 | 0.298 | 0.204 | 0.010 | 0.6700 |
| July Monthly | 224312 | 0.085 | 0.292 | 0.558 | 0.010 | 0.9450 |
| August Monthly | 227198 | 0.182 | 0.139 | 0.346 | 0.024 | 0.7302 |
| August Monthly | 227199 | 0.084 | 0.150 | 0.451 | 0.033 | 0.7180 |
| September Monthly | 228043 | 0.140 | 0.051 | 0.209 | 0.010 | 0.4284 |
| September Monthly | 228044 | 0.034 | 0.010 | 0.010 | 0.010 | 0.0640 |
| October Monthly | 229922 | 0.222 | 0.095 | 0.021 | 0.010 | 0.3650 |
| October Monthly | 229923 | 0.131 | 0.066 | 0.018 | 0.010 | 0.2250 |
| Average: | | 0.1155 | 0.0954 | 0.3541 | 0.0121 | 0.5948 |

The average impurity content of the polycrystalline silicon logs of the Comparative Example, as measured at monthly intervals over a period of at least four months (when all impurities are measured), is about 0.824 ppba, or 824 ppta.

Obviously, many modifications and variations of the present invention are possible in light of the above teachings, and the invention may be practiced otherwise than as specifically described within the scope of the appended claims.

What is claimed is:

1. A method of determining an amount of impurities that a candidate material contributes to high purity silicon during a heating process, said method comprising:
    determining an impurity content of the candidate material;
    determining an impurity content of the high purity silicon;
    providing the candidate material to be tested, wherein the candidate material is powder, particulate, a cylinder, or chunks, or any mixture thereof;
    encasing a sample of the high purity silicon in the candidate material;
    preventing impurities from a furnace material composition from reaching any portion of the sample encased in the candidate material, wherein the candidate material comprises a distinct material composition relative to the furnace material composition;
    heating the sample that is encased in the candidate material within a furnace formed of the furnace material composition; and
    determining a change in the impurity content of the high purity silicon caused by the candidate material after heating the sample that is encased in the candidate material, wherein the change is compared to the impurity content of the high purity silicon prior to heating the sample.

2. A method as set forth in claim 1, wherein the high purity silicon is further defined as a silicon having an impurity content of less than or equal to 500 parts per trillion atomic.

3. A method as set forth in claim 1, wherein the sample that is encased in the candidate material is heated at a temperature of at least 1650° F. for a period of at least 200 minutes.

4. A method as set forth in claim 1, wherein the impurities are selected from the group consisting of aluminum, arsenic, boron, phosphorous, iron, nickel, copper, chromium, and combinations thereof.

5. A method as set forth in claim 4, wherein the candidate material comprises at least one ceramic present in an amount of at least 40 percent by weight based on the total weight of the candidate material.

6. A method set forth in claim 5, wherein the at least one ceramic is selected from the group consisting of aluminum oxide, silicon dioxide, silicon carbide, and combinations thereof.

7. A method as set forth in claim 1, wherein the step of encasing a sample of the high purity silicon is performed prior to heating the sample within the furnace.

* * * * *